United States Patent [19]

Asai et al.

[11] Patent Number: 4,977,437
[45] Date of Patent: Dec. 11, 1990

[54] METHOD AND APPARATUS FOR PERFORMING PRESSURE DEVELOPEMENT WITH A PAIR OF PRESSURIZING ROLLERS

[75] Inventors: Shin Asai, Ichinomiya; Michitoshi Akao, Nagoya; Tokunori Katoh; Kenji Sakakibara, both of Ichinomiya; Takesi Izaki, Nagoya; Hiroshi Morisaki, Nishikasugai, all of Japan

[73] Assignee: Brother Kogyo Kabushiki Kaisha, Aichi, Japan

[21] Appl. No.: 472,180

[22] Filed: Jan. 30, 1990

[30] Foreign Application Priority Data

| Jan. 30, 1989 | [JP] | Japan | 1-20406 |
| Jan. 30, 1989 | [JP] | Japan | 1-20505 |
| Jan. 30, 1989 | [JP] | Japan | 1-20507 |
| Jan. 30, 1989 | [JP] | Japan | 1-20508 |
| Jan. 31, 1989 | [JP] | Japan | 1-22926 |

[51] Int. Cl.$^5$ ............................................. G03B 27/32
[52] U.S. Cl. .................................... 355/27; 355/77
[58] Field of Search ................... 355/27, 28, 32, 77, 355/308; 430/138

[56] References Cited

U.S. PATENT DOCUMENTS 4,920,375  4/1990  Akao et al. ........................ 355/27

Primary Examiner—L. T. Hix
Assistant Examiner—Khanh Dang
Attorney, Agent, or Firm—Oliff & Berridge

[57] ABSTRACT

An image recording apparatus for recording an image of an original on a developer sheet with the use of a microcapsule, in which the developer sheet and the microcapsule sheet having a surface coated with immense number of photosensitive and pressure-rupturable microcapsules are subjected to pressure development by a pair of pressurizing rollers. To ensure that the pressure development is performed under the condition where the developer sheet and the microcapsule sheet are superposed one on the other, the nip and retract timings of the pressurizing rollers are determined properly according to the present invention. For example, the developer sheet is conveyed at a speed asynchronous with the microcapsule conveying speed and the conveyance of the developer sheet is stopped after its leading edge is introduced between the rollers held in spaced apart condition. The rollers are brought to the nip position to thereby start the pressure development when the exposure start line on the microcapsule sheet is in alignment with the leading end of the developer sheet. The retract timing is determined, for example, depending upon the size of the developer sheet.

31 Claims, 7 Drawing Sheets

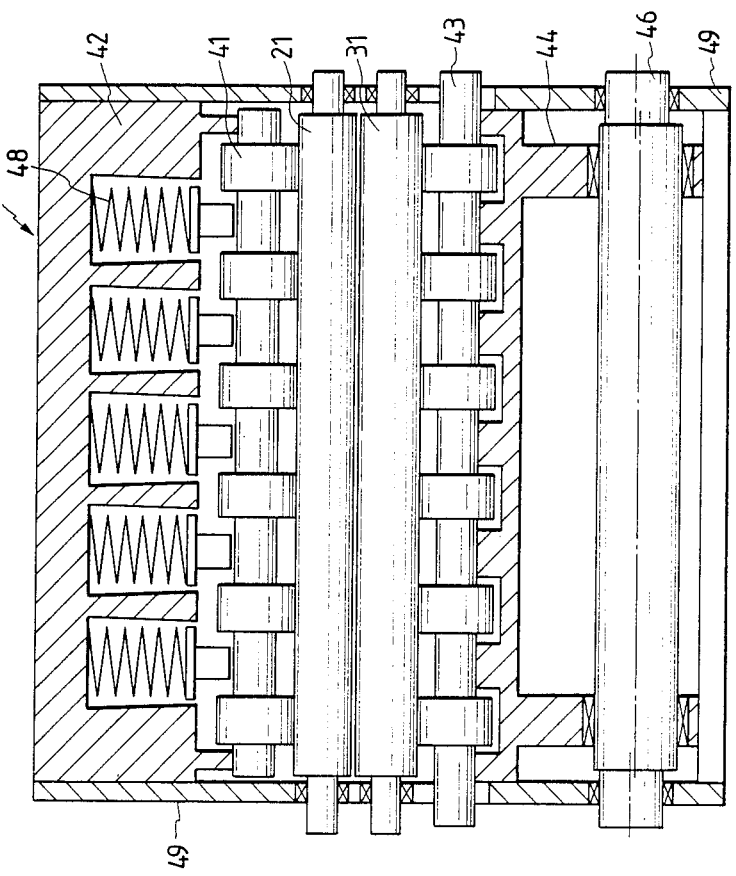
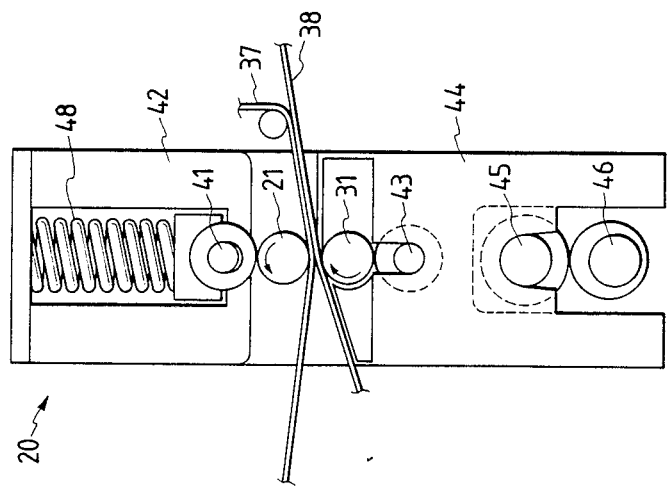

METHOD AND APPARATUS FOR PERFORMING PRESSURE DEVELOPEMENT WITH A PAIR OF PRESSURIZING ROLLERS

BACKGROUND OF THE INVENTION

The present invention relates generally to method and apparatus for recording an image on a developer sheet having a surface coated with a developer material while using a photosensitive pressure-sensitive recording medium having a surface coated with an immense number of pressure-rupturable microcapsules (hereinafter referred to as "a microcapsule sheet"). More particularly, the invention relates to method and apparatus for performing pressure development with a pair of pressurizing rollers, in which timings at which the rollers are brought to nip and retract positions are determined in precise manner.

In an image recording apparatus of the type using recording media comprising an elongated, web-like microcapsule sheet and a developer sheet in the form of cut sheet, the microcapsule sheet which has been accommodated in a cassette in a rolled state is withdrawn therefrom and is exposed to imaging light to form a latent image thereon. The developer sheet is fed out from another cassette typically at a timing in coincidence with the start of the exposure onto the microcapsule sheet and is conveyed at a speed in synchronism with the conveying speed of the microcapsule sheet so that the developer sheet is superposed on the exposed region of the microcapsule sheet. The two sheets thus superposed are introduced into a developing station comprising a pair of pressurizing rollers to thereby develop the latent image on the microcapsule sheet and reproduce a visible image on the developer sheet while applying a high pressure to the superposed sheets.

The pressurizing rollers are selectively held in spaced apart condition (retract position) and an intimate contact condition (nip position). The pressure development can be performed when the rollers are in the nip position. The rollers have been held in the retract position to allow the sheets to be introduced into a space between the two rollers. When the leading ends of the two sheets are introduced thereinto, the rollers are moved toward each other and held in the retract position at a predetermined timing (hereinafter referred to as "nip timing") to thus start the pressure development. As the pressure development proceeds and at a timing when the development in the exposure zone has terminated, the rollers are brought to the retract position. This timing will herein after referred to as "retract timing". The nip timing is determined based on the detection of the leading end of the developer sheet at a predetermined position upstream of the developing station, and the retract timing is determined based on a predetermined number of rotations of one of the pressurizing rollers counted from the nip timing. The retract timing may alternatively be determined based on the detection of the trailing end of the developer sheet. Specifically, it may be determined based on a predetermined number of rotations of one of the pressurizing rollers counted from the trailing end of the developer sheet.

In the case where the retract timing is determined in association with the detection of the leading end of the developer sheet, the pressurizing rollers are still held in the nip position if the developer sheet used is of short length. In this case, only the microcapsule sheet is applied with the pressure after the developer sheet has been transported past the pressurizing rollers. As a result, the pressurizing rollers are smeared with a chromogenic material released with the ruptured microcapsules. The smeared rollers are incapable of performing uniform pressure development for the sheets which follow. There may be cases where the developer sheet is wrinkles due to the transportation by the smeared rollers.

On the other hand, in the case where the retract timing is determined in association with the detection of the trailing end of the developer sheet, the above-mentioned drawback can be obviated. However, due to the variation in the setting position of the sensor for sensing the trailing end of the developer sheet, the occurrence of the retract timing is not in agreement with the actual trailing portion of the exposed zone on the microcapsule sheet, whereby the trailing end position of the reproduced image becomes different in the respective apparatuses.

Even if the regular size developer sheet is used, it is necessary that the developer sheet be introduced into the developing station without fail. Otherwise, the pressurizing rollers are smeared with the chromogenic material as described above. To ensure the feeding of the developer sheet, it has been proposed to employ a sensor for sensing the leading edge of the developer sheet and to dispose feed rollers at a position upstream of the developing station for conveying the developer sheet a predetermined distance toward the developing station upon sensing the leading edge of the developer sheet. However, if the feed rollers have been smeared or if double-superposed developer sheets have been reached, the feed rollers tend to slip with respect to the developer sheets. As a result, the developer sheet is not fed into the developing station, whereby the microcapsule sheet is solely applied with pressure and thus the smearing of the pressurizing rollers results.

In the recording apparatus provided with an exposure amount adjusting function or a copying magnification selection function, typically the conveying speed of the microcapsule is changed depending upon the exposure amount as set or the selected copying magnification. However, the nip timing is not changed attendant to the change of the conveying speed of the microcapsule sheet, with the result that the nip timing is advanced or delayed. In the case where the nip timing is advanced, i.e., when the pressure application is taken place before the developer sheet has been introduced, the microcapsule sheet is solely applied with the pressure, whereby the smearing of the pressuring rollers results. On the other hand, in the case where the nip timing is delayed, i.e., when the pressure application is taken place after the leading exposure zone has passes over, the leading exposure zone will not be subjected to pressure development. Further, the retract timing is advanced or delayed corresponding to the advancement or delay of the nip timing, since the pressurizing rollers are brought to the retract position when the superposed sheets are conveyed a predetermined distance by the pressurizing rollers, which distance is determined by the number of rotations of one of the pressurizing rollers. To summarize, when the exposure amount is adjusted or when enlarged or reduced size copy is to be obtained, the image location on the developer sheet is displaced and a part of the image is not reproduced.

When the same original document is successively copied, a problem exists such that the trailing end portion of the precedingly fed developer sheet remains in the nip between the pressurizing rollers when the subsequently fed developer sheet is to be introduced into the gap between the pressurizing rollers. This is due to the fact that the timing at which the feeding of the developer sheet is performed in coincidence with the start timing of the exposure. Under such a condition, the subsequently fed developer sheet cannot be introduced into the gap between the pressurizing rollers, or the leading end portion of the subsequently fed developer sheet is overlapped on the trailing end portion of the precedingly fed developer sheet and introduced thereinto in the overlapped condition. In the latter case, the overlapped portions are not properly pressure developed.

SUMMARY OF THE INVENTION

The present invention has been made to solve the above-mentioned problems, and according it is an object of the present invention to provide method and apparatus for recording an image of an original document on a developer sheet with the use of a photosensitive pressure-sensitive sheet, i.e., microcapsule sheet, in which when a pressure development is carried out by a pair of pressurizing rollers, the rollers are prevented from being smeared with the material released from the ruptured microcapsules.

Another object of the present invention is to provide method and apparatus in which a nip timing and a retract timing of the pressurizing rollers are accurately controlled.

To achieve the above and other objects of the present invention, there is provided according to one aspect of the present invention, an image recording apparatus for recording an image of an original document on a developer sheet with the use of a photosensitive pressure sensitive sheet, the developer sheet having leading and trailing ends and having a surface coated with a developer material, the photosensitive pressure-sensitive sheet having a surface coated with immense number of photosensitive and pressure-rupturable microcapsules, each encapsulating a chromogenic material, the apparatus comprising exposure means for exposing the photosensitive pressure-sensitive sheet to imaging light over a part of the photosensitive pressure-sensitive sheet, the part being defined by leading the trailing exposure lines to selectively change mechanical strength of the microcapsules in the part and to thereby form a latent image thereon, first conveying means for conveying the photosensitive pressure-sensitive sheet formed with the latent image thereon, pressure developing means having a pressure developing position for pressure developing the latent image and reproducing a visible image on the developer sheet upon reaction of the chromogenic material released from ruptured microcapsules with the developer material, the pressure developing means including a pair of pressurizing members, second conveying means for conveying the developer sheet in a direction toward the pressure developing means, actuating means for actuating at least one of the first and second pressurizing members to selectively bring the first and second pressurizing members in a spaced apart condition and an intimate contact condition, the first and second pressurizing members being held in the spaced apart condition when the developer sheet is conveyed by the second conveying means, and stopping means for temporarily stopping the conveyance of the developer sheet by the second conveying means when the leading end of the developer sheet has been introduced between the pressurizing members held in spaced apart condition, wherein the actuating means actuates at least one of the first and second pressurizing members to bring them in the intimate contact condition at a timing when the exposure leading end of the photosensitive pressure-sensitive sheet is in alignment with the leading end of the developer sheet to thus start the pressure development. The photosensitive pressure-sensitive sheet is conveyed by the first conveying means at a preselected speed and the actuating means further actuates at least one of the first and second pressurizing members to bring them in the spaced apart condition in accordance with the preselected speed to thus terminate the pressure development.

The conveying speed of the photosensitive pressure-sensitive sheet is determined depending upon either a copying magnification defined by a reproduced image size with respect to an original image size or an amount of the imaging light. Status detecting means may further be provided which detects whether the first and second pressurizing members are held in the spaced apart condition or in the intimate contact condition and outputs an inhibition signal when the first and second pressurizing members are held in the intimate contact condition, and wherein the second conveying means is inhibited from conveying the developer sheet in response to the inhibition signal. First sheet detecting mean is disposed upstream of the pressure developing means with respect to the developer sheet conveying direction for detecting the trailing end of the developer sheet and producing a trailing end detection signal, and wherein the pressurizing members are brought to the spaced apart condition in response to the trailing end detection signal. Second sheet detection means is further disposed upstream of the developer sheet conveying direction with respect to the developer sheet conveying direction for detecting the leading end of the developer sheet and producing a leading end detection signal, and wherein the second conveying means again conveys the developer sheet when the actuating means actuates at least one of the firsts and second pressurizing members to bring them in the intimate contact condition.

According to another aspect of the present invention, there is provided an image recording apparatus for recording an image of an original document on a developer sheet with the use of a photosensitive pressure sensitive sheet, the developer sheet having leading and trailing ends and having a surface coated with a developer material, the photosensitive pressure-sensitive sheet having a surface coated with immense number of photosensitive and pressure-rupturable microcapsules, each encapsulating a chromogenic material, the apparatus comprising exposure means for exposing the photosensitive pressure-sensitive sheet at a position to imaging light over a part of the photosensitive pressure-sensitive sheet, the part being defined by leading and trailing exposure lines to selectively change mechanical strength of the microcapsules in the part and to thereby form a latent image thereon, first conveying means for conveying the photosensitive pressure-sensitive sheet formed with the latent image thereon at a speed, pressure developing means having a pressure developing position for pressure developing the latent image and reproducing a visible image on the developer sheet upon reaction of the chromogenic material released from ruptured microcapsules with the developer material, the pressure developing means including a pair of pressurizing members, second conveying means for conveying the developer sheet in a direction toward the pressure developing means, actuating means for actuating at least one of the first and second pressurizing members to selectively bring the first and second pressurizing members in a spaced apart condition and an intimate contact condition, the first and second pressurizing members being held in the spaced apart condition when the developer sheet is conveyed by the second conveying means, and control means for controlling the actuating means so that the first and second pressurizing members are brought to the intimate contact condition after a first predetermined period of time has elapsed from a start of the exposure to thus start the pressure development, the first predetermined period of time being defined by a distance between the exposure position and the pressure developing position and the photosensitive pressure-sensitive conveying speed.

According to still another aspect of the present invention, there is provided a method of recording an image of an original document on a developer sheet with the use of a photosensitive pressure sensitive sheet, the developer sheet having leading and trailing ends and having a surface coated with a developer material, the photosensitive pressure-sensitive sheet having a surface coated with immense number of photosensitive and pressure-rupturable microcapsules, each encapsulating a chromogenic material, the method comprising the steps of exposing a part of the photosensitive pressure-sensitive sheet to imaging light to selectively change mechanical strength of the microcapsules in the part and to thereby form a latent image thereon, the part being defined by leading and trailing exposure lines, conveying the photosensitive pressure-sensitive sheet formed with the latent image thereon, pressure developing the latent image at a pressure developing position with a pair of pressurizing members and reproducing a visible image on the developer sheet upon reaction of the chromogenic material released from ruptured microcapsules with the developer material, conveying the developer sheet in a direction toward the pressurizing members, actuating at least one of the first and second pressurizing members to selectively bring the first and second pressurizing members in a spaced apart condition and an intimate contact condition, the first and second pressurizing members being held in the spaced apart condition when the developer sheet is conveyed by the second conveying means, and temporarily stopping the conveyance of the developer sheet when the leading end of the developer sheet has been introduced between the pressurizing members held in spaced apart condition, wherein at least one of the first and second pressurizing members being actuated to bring them in the intimate contact condition at a timing when the exposure leading end of the photosensitive pressure-sensitive sheet is in alignment with the leading end of the developer sheet to thus start the pressure development.

The photosensitive pressure-sensitive sheet is conveyed at a preselected speed and at least one of the first and second pressurizing members are further actuated to be brought to the spaced apart condition in accordance with the preselected speed to thus terminate the pressure development. The method further comprises detecting the leading end of the developer sheet and producing a detection signal and the developer sheet is again conveyed after at least one of the first and second pressurizing rollers are brought to the intimate condition.

The above and other objects, features and advantages of the present invention will become more apparent from the following description when taken in conjunction with the accompanying drawings in which preferred embodiments of the present invention are shown by way of illustrative examples.

BRIEF DESCRIPTION OF THE DRAWINGS

FIG. 2 is a side cross-sectional view showing one example of the arrangement of a pressure developing station;

FIG. 3 is a front cross-sectional view showing another example of the arrangement of a pressure developing station;

DETAILED DESCRIPTION OF THE PREFERRED EMBODIMENTS

Figure 1:
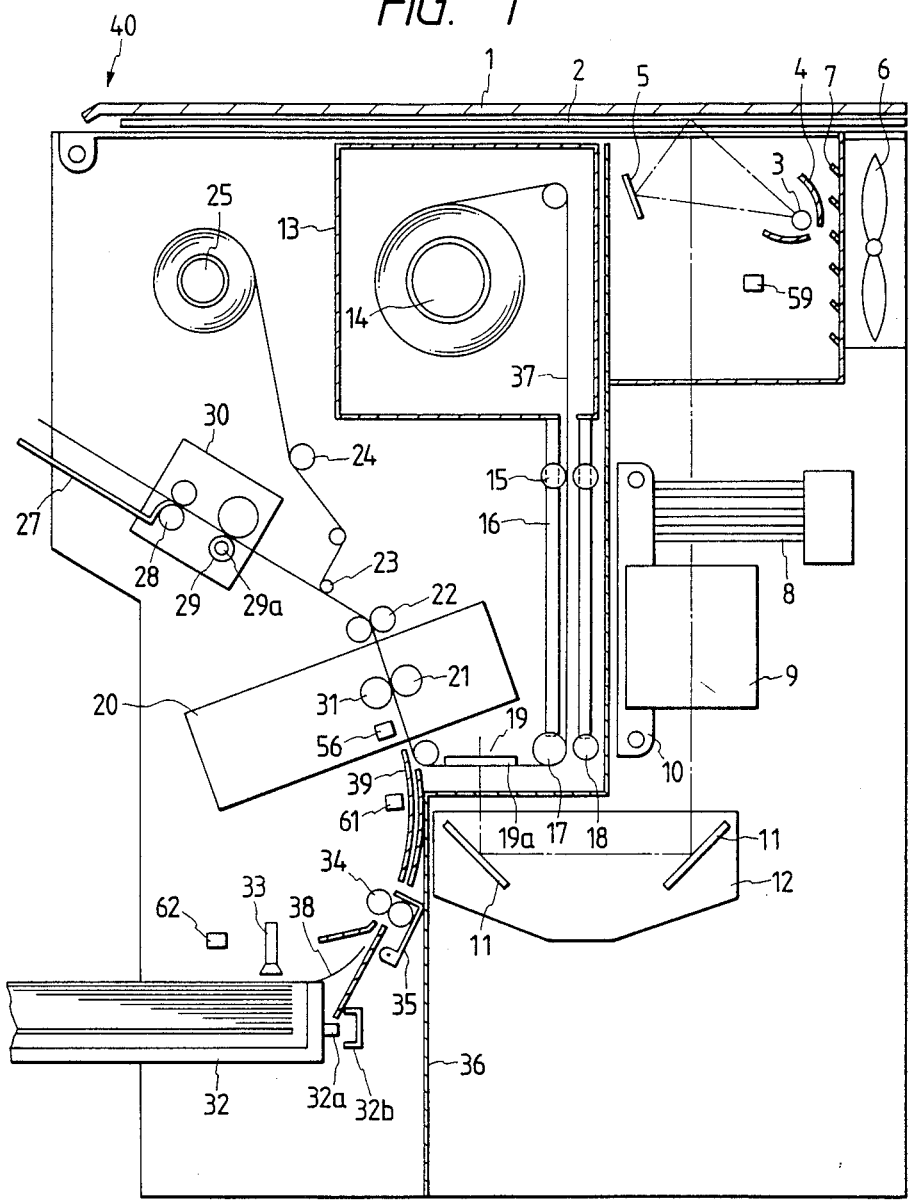
FIG. 1 is a vertical cross-sectional view showing an image recording apparatus according to the present invention.

FIG. 1 shows an image recording apparatus 40 capable of performing a full-color recording or copying. In this apparatus, a microcapsule sheet as disclosed in U.S. Pat. No. 4,399,209 to Sanders et al is used. Briefly, the microcapsule sheer is coated with an immense number of microcapsules on one surface thereof. The microcapsule encapsulates photo-curing (or photo-softening) resin and a chromogenic material of one of three primary colors, i.e. cyan, magenta and yellow. In image reproduction, a separate image receiving sheet referred generally to as developer sheet is used in combination with the microcapsule sheet, which has a surface coated with a developer material. When the microcapsule sheet is exposed to an imaging light, the mechanical strength of the exposed microcapsules is changed from soft to hard or vice versa to thereby form a latent image thereon. The microcapsule sheet formed with the latent image and the developer sheet are superposed one on the other, and the latent image is developed under pressure and a visible image is reproduced on the developer sheet by rupturing the microcapsules of weaker mechanical strength and having the chromogenic material released therefrom react with the developer material.

Referring to FIG. 1, a light shielding partition plate 23 is disposed in the apparatus 40 to spacedly divide the apparatus 40 into two chambers. That is, a light source unit and an optical system are disposed within one chamber whereas other requisite units, such as a pressure developing and thermal fixing stations, are disposed within the other chamber.

An elongated web-like microcapsule sheet 37 wound around a cartridge shaft 14 is retained in a microcapsule sheet cartridge 13 that is detachably disposed at a position immediately below an original support pane 2 and is formed with a bottom opening 13A. An exposure station 19 is disposed below the sheet cartridge 13 at a downstream side thereof. The sheet 37 passes through a number of rollers and the pressure developing station 20, and a leading end of the sheet 37 is attached to a take-up shaft 25 positioned beside the sheet cartridge 13. Between the sheet cartridge 13 and the exposure station 19, feed roller 15 and a guide roller 17 are rotatably provided at a vertical sheet path for guide travel of the sheet toward the exposure station 19. At the downstream of the exposure station 19, there is provided the pressure developing station 20 which includes first and second pressurizing rollers 21, 31.

At a lower portion of the apparatus 40, there is provided a developer sheet cassette 32 for storing therein a stack of developer sheets 38. Immediately above the cassette 32, a feedout member 33 is provided for feeding the uppermost developer sheet 38 toward the pressure developing station 20. In stead of the feedout member 33, a feedout member may be used which is pivotally movably supported above the stack of the developer sheet 38 and has a lower end connected with a suction cup. Applying a negative pressure to the suction cup, the uppermost developer sheet 38 is attracted to the suction cup and is separated from the reminder. The developer sheet 38 attracted thereto is taken out from the cassette 32 in accordance with the pivotal movement of the feedout member 39 and is released from the suction cup by the application of the positive pressure thereto.

Between the cassette 32 and the pressure developing station 20, a pair of feed rollers 34 and a registration gate 35 are provided. The registration gate 35 and the feed rollers 34 perform alignment of the leading edge of the developer sheet 38 and thereafter feed the developer sheet 38 toward the pressure developing station 20.

Next, an optical system and optical path in the apparatus 40 will be described. As shown, the apparatus 40 has its top plate portion provided with a cover member 1 and the original support pane 2. The original support pane 2 is formed of a light transmissive material and is movable in the horizontal direction and on which an original document (not shown) is placed face down. At the upper right side of the apparatus 40, fixedly provided is a halogen lamp 3 extending in the direction perpendicular to the sheet of drawing, and a semi-cylindrically shaped reflector 4 is disposed to surround the lamp 3. The halogen lamp 3 emits a light toward the original support pane 2.

Therefore, the light emitted from the halogen lamp 3 can be sequentially irradiated onto the entire surface over the region from one to the other end of the original support pane 2 as the original support pane 2 moves horizontally. The light from halogen lamp 3 passes through the transparent original support pane 2 and is reflected from the original placed thereon. The cover member 1 is provided to prevent this light from leaking out of the apparatus. To irradiate the light from the halogen lamp 3 onto the original at a high efficiency, a flat reflector 5 is disposed to face the halogen lamp 3 and receive the light from the lamp 3 and directs it toward the original document. At the rear side of the halogen lamp 3, there are provided a fan 6 and a louver 7 for introducing an external air into the apparatus, with which air is effectively impinged upon the lamp 3 to cool the same.

A filter unit 8 having a plurality of filter elements is disposed below the original support pane 2. Further, a lens unit 9 is provided below the filter unit 8. Light emitted from the halogen lamp 3 and reflected from the original document passes through the filter elements 8 and enters the lens unit 9. The filter elements alter the light transmissive characteristic in accordance with the sensitivity characteristics of the microcapsule sheet 37, to thereby adjust the color tone of a copied output image. The lens 9 is fixedly secured to a lens mounting plate 19, and fine angular adjustment of this lens with respect to a light path is achievable. The lens unit 9 is capable of being vertically moved by a lens moving device 51 (see FIG. 2) so that a copying magnification is changed.

A pair of reflection mirrors 37 are provided below lens 9 changes its direction by 180 degrees (completely reverse direction) by the two reflection mirrors 37, and the thus oriented light is applied to the microcapsule sheet 37 closely contacting the bottom of an exposure table 19A to form the latent image thereon. The two reflection mirrors 37 are securely mounted to a mirror mounting plate 12. The mirror mounting plate 12 is vertically movably provided so that the adjustment of the distance of the light path and focusing adjustment can be effected by fine adjustment of the position of the mirror mounting plate 12. The original, the filter 8, the lens 9, the pair of reflection mirrors 37 and the exposure table 19A define a U-shape or J-shape light path in combination. That is, the optical path is bent into U-shape or J-shape, which path comprises a first vertical path directed downwardly, a second path directed horizontally and a third path directed upwardly. At the first optical path, the light reflected from the original is oriented downwardly, and at the third path the light is directed toward the imaging surface of the microcapsule sheet 37 at the exposure zone 19A, and the reflection mirror unit (37, 12) is disposed at the second optical path extending in horizontal direction. When the mirror mounting plate 12 is downwardly moved by a certain distance, the total light path distance is increased by a distance twice as long as the moving distance of the plate 12, yet maintaining the focusing position on the exposure zone 19A unchanged.

The mirror mounting plate 12 can maintain relative angular positional relationship between the pair of mirrors 37 regardless of the vertical movement of the plate 12. Accordingly, the plate 12 fixedly mounting the two mirrors can be simply assembled to the recording apparatus 40 as those can be treated as a single integral unit. It should be noted that only the pair of reflection mirrors 37 are required to obtain a normal upstanding or erect imaging direction at the exposure zone 19A, since the light is finally applied to the exposure zone upwardly, i.e, the microcapsule sheet 37 is exposed to light at the exposure zone 19A with the microcapsule coated surface facing down.

At downstream of the pressure developing station 20, a pair of feed rollers 22 are provided for transporting the microcapsule sheet 37 at a preselected constant speed. More specifically, the feed rollers 22 are rotated by a motor 52 (see FIG. 3), and the number of rotations of the motor 52 is changed in accordance with the horizontally moving speed of the original support pane 2 and the copying magnification. When copying is made at equi-magnification, the transporting speed of the microcapsule sheet 37 is controlled to be in coincidence with the moving speed of the original support pane 2.

At downstream of the feed rollers 22, a sheet separation mechanism including a separation roller 23 is provided at which the microcapsule sheet 37 is separated from the developer sheet 38. The separated microcapsule sheet 37 is taken-up by the take-up shaft 25 through a meander travel control roller 24. On the other hand, a thermal fixing station 30 is provided at the downstream of the separation roller 23. The thermal fixing station 30 includes a hollow heat roller 29, in the interior of which a heater element 30A is disposed. Further, a pair of feed rollers 28 are provided to feed the image fixed developer sheet 38 toward a discharge tray 27.

Operation of the apparatus 40 arranged as above will be described.

The microcapsule sheet 37 drawn out from the opening 13A of the cartridge 13 is fed by the feed rollers 15 and guided by the barrel roller 17. The sheet 37 then passes while contacting the lower face of the exposure table 19A where imaging light is applied to the sheet 15, so that a latent image is formed on the sheet 37.

More specifically, the cover member 1 is lifted up for placing the original document on the original support pane 2. Then, when a start button (not shown) is depressed, the original support pane 2 is moved to one direction (rightwardly in FIG. 1), so that one side edge of the pane 2 (left side edge in FIG. 1) stops at a first position where the one side edge of the pane 2 is coming into confrontation with the light source. Thereafter, with the halogen lamp 3 being lit, the original support pane 2 is then moved in a second direction (leftwardly in FIG. 1) opposite the first direction. The light emitted from the halogen lamp 3 is reflected from the original, and the light reflected therefrom passes through the filter 8 and lens 9 and is reflected at the two reflection mirrors 37. The last reflected light is finally directed toward the microcapsule sheet 37 which is located under the exposure table 19A, thereby forming a latent image on the sheet 37. The microcapsule sheet 37 is moved under the exposure table 19A in the second direction (leftwardly in FIG. 1) at a predetermined speed relative to the moving speed of the original support pane 2. The moving speed of the microcapsule sheet 37 is determined depending upon the copying magnitude. In the case of equi-magnification copying, the microcapsule sheet 37 is moved at the same speed as the moving speed of the original support pane 2 whereby the latent image having the same size as the original image is formed on the microcapsule sheet 37. Since the conveying speed of the microcapsule sheet 37 is controlled to be constant by feed rollers 22 and is set a given ratio to the moving speed of the original support pane 2 depending upon a copying magnification, line latent images having given widths are sequentially formed on the microcapsule sheet 37 that is passing along the lower surface of the exposure table 19A.

The sheet 37 is then fed to the pressure developing station 20 by the guide roller 17. At the pressure developing station 20, the sheet 37 and the developer sheet 38 are held in facial contact with each other and are applied with pressure to develop the latent image and form a visible image on the developer sheet 38. The microcapsule sheet 37 leaving from the cartridge 13 is kept unexposed to light due to the presence of a shielding cover 16. The developer sheets 38 are fed out one by one by the feedout member 33, and each sheet 38 is fed to a sheet inlet of the pressure developing station 20 after the leading edge of the sheet 38 is aligned by the feed rollers 34 and the registration gate 35.

The microcapsule coated surface of the sheet 37 on which a latent image is formed contacts the developer coated surface of the developer sheet 38 inside the pressure developing station 20, and these superposed sheets are pressed together by the pressurizing rollers 21, 31. Unexposed microcapsules are ruptured by the pressure applied, to thereby form an output image on the developer sheet 38 due to the reaction of the chromogenic material released from the ruptured microcapsules with the developer material.

In summary, in timed relation with the movement of the original support pane 2 in the second direction, the feedout member 33 feeds out the developer sheets 38 one by one from the developer sheet cassette 32. The developer sheet 37 is brought to facial contact with the exposed microcapsule sheet 37 and the both sheets are fed to the pressure developing station 20 in which the latent image on the microcapsule sheet 37 is developed and transferred onto the developer sheet 38.

The microcapsule sheet 37 and developer sheet 38 leaving from the pressure developing station 20 are fed out by the feed rollers 22 and are separated by the separation roller 23, the former sheet 37 directing upward and the latter sheet 38 directing in the straight direction. Thereafter, the developer sheet 38 is subjected to thermal fixing in the thermal fixing station 30 and is then discharged onto the discharge tray 27 face up. The microcapsule sheet 37 leaving from the pressure developing station 20 and passing through the separation roller 23 and the meandering control roller 24 is wound around the take-up shaft 25. When the movement of the original support pane 2 is stopped at a second position where another edge (right side in FIG. 1) of the pane 2 confronts the light source, the scanning of the original document is completed and the halogen lamp 3 is turned off.

Next, referring to FIGS. 2 and 3, the arrangements of the pressure developing stations 20 will be described. FIG. 2 is a side cross-section showing one example of the pressure developing station 20, and FIG. 3 is a front cross-section showing another example thereof. These two examples are substantially of the same arrangement but are slightly different as will be apparent from the following description.

In the examples shown in FIGS. 2 and 3, the pressure developing station 20 includes a pair of pressurizing rollers 21, 31 each having an axis extending in the widthwise direction of the sheets to be fed and being rotatably supported between opposing side plates 49. A first frame 42 is fixedly provided between the opposing side plates 49. Springs 48 and first backup rollers 21 are provided in association with the first frame 42 in such a manner that one end of each spring 48 is attached to the first frame 42, and the first backup rollers 41 are rotatably and vertically movably interposed between the other ends of the springs 48 and the first pressurizing rollers 21. A second frame 44 is vertically movably provided between the opposing side plates 49. A cam shaft 46 is rotatably supported between the opposing side plates 49 and is rotated by a drive source 53 (see FIG. 4). The cam shaft 46 has an eccentric cam on its periphery, the cam surface of which is, in the case of FIG. 2, in abutment with frame lift rollers 45 rotatably suported on the second frame 44, and in the case of FIG. 3, in engagement with the second frame 44 through bearings. Second backup rollers 31 are rotatably and vertically movably interposed between the second frame 44 and the second pressurizing roller 31.

In operation, when the cam shaft 46 rotates and the eccentric cam is brought to a position where the lift amount thereof is the minimum, the second frame 44 moves away from the first frame 43. That is, the first and second pressurizing rollers 21, 31 are held in the spaced apart condition. On the other hand, when the eccentric cam is brought to a position where the lift amount thereof is the maximum, the second frame 44 is elevated through the frame lift roller 45 and thus the second pressurizing roller 31 moves upwardly. At this time, since the first pressurizing roller 21 is downwardly urged by the springs 48, the two pressurizing rollers 21, 31 are pressed against each other.

A first embodiment of the present invention will now be described with reference to FIGS. 4 and 7. The first embodiment concerns the determination of the nip and retract timings of the pressurizing rollers 21, 31.

In this embodiment, a sheet edge sensor 56 is disposed in a predetermined position within the pressure developing station and in upstream position of the pressurizing rollers 21, 31, as shown in FIG. 1. The sensor 56 senses the leading and trailing ends of the developer sheet 38. An exposure amount sensor 59 is disposed in the lower position of the halogen lamp 3 for sensing an amount of light irradiated from the halogen lamp 3 or the exposure amount applied to the microcapsule sheet 37.

Figure 4:
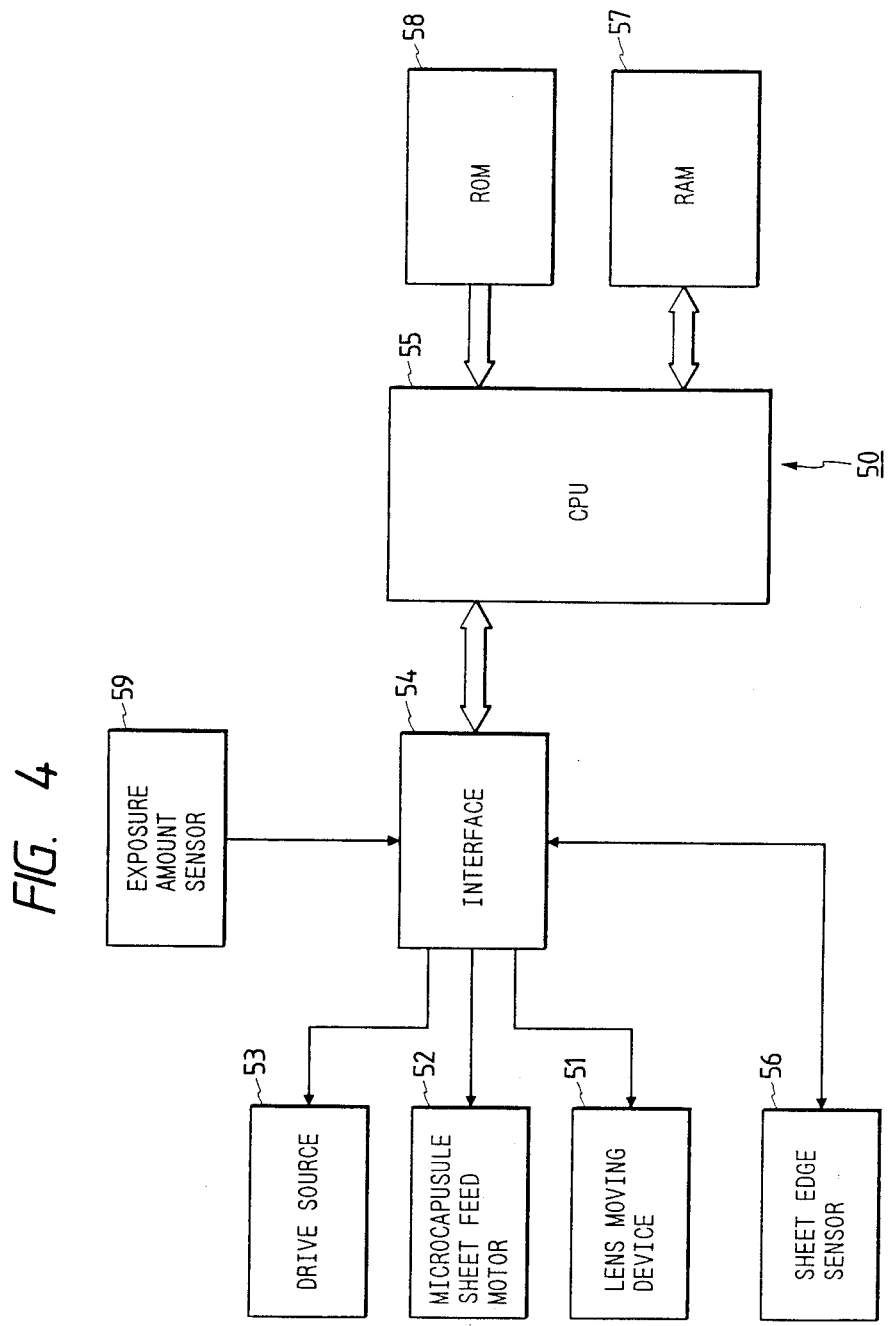
FIGS. 4 through 6 are block diagrams showing control circuits according to the embodiments the present invention.

In FIG. 4, shown is a control device 50 incorporated in the recording apparatus 40. The control device 50 includes the central processing unit (CPU) 50, to which connected through an interface 54 are the cam shaft drive source 53 for rotating the cam shaft 46, the sheet edge sensor 56, the exposure amount sensor 59, the lens moving device 51, and a microcapsule sheet feed motor 52 coupled to one of the feed rollers 22 for feeding the microcapsule sheet 37. To the CPU 55, a random access memory (RAM) 57 and a read-only memory (ROM) 58 are connected. The RAM 57 provides a work area for the CPU 55. The ROM 58 stores a program to be implemented by the CPU 55 and data necessary for determining the nip and retract timings.

In operation, when the exposure starts, the developer sheet 38 fed out by the feedout member 33 is conveyed toward the pressure developing station 20 at a predetermined constant speed asynchronous with the rotational speed of the feed rollers 22. That is, the conveying speed of the developer sheet 38 is not correlated with the conveying speed of the microcapsule sheet 37. The conveying speed of the microcapsule sheet 37 is determined by the CPU 55 based on the copying magnification and/or exposure amount. Specifically, when a particular copying magnification is designated by the user, the lens moving device 51 is vertically moved to a position corresponding to the designated copying magnification. Then, the CPU 55 controls the motor 52 in accordance with the position of the lens moving device 51. That is, the motor 52 rotates at a speed corresponding to the designated copying magnification. The conveying speed of the microcapsule sheet 37 is also determined based on the exposure amount sensed by the sensor 59.

When the leading end of the developer sheet 38 is sensed by the sensor 56 and when the output of the sensor 56 is fed to the CPU 55, the latter actuates a delay timer (not shown). Then, one of the feed rollers 34 is rotated for a predetermined period of time so that the developer sheet 38 is further conveyed a predetermined distance from the detection of the leading end of the developer sheet 38. The developer sheet 38 is conveyed to a position slightly exceeding the nip position and stops there.

There is stored in the ROM 50 distances between the exposure start position and the leading end position of the developer sheet 38 staying in the developing station 20 corresponding to the conveying speeds of the microcapsule sheet 37. There is further stored in the ROM 50 retract timings corresponding to the conveying speeds of the microcapsule sheet 37. A counter (not shown) is provided in association with an encoder (not shown) which in turn is provided in association with an original support pane moving motor (not shown).

Figure 7:
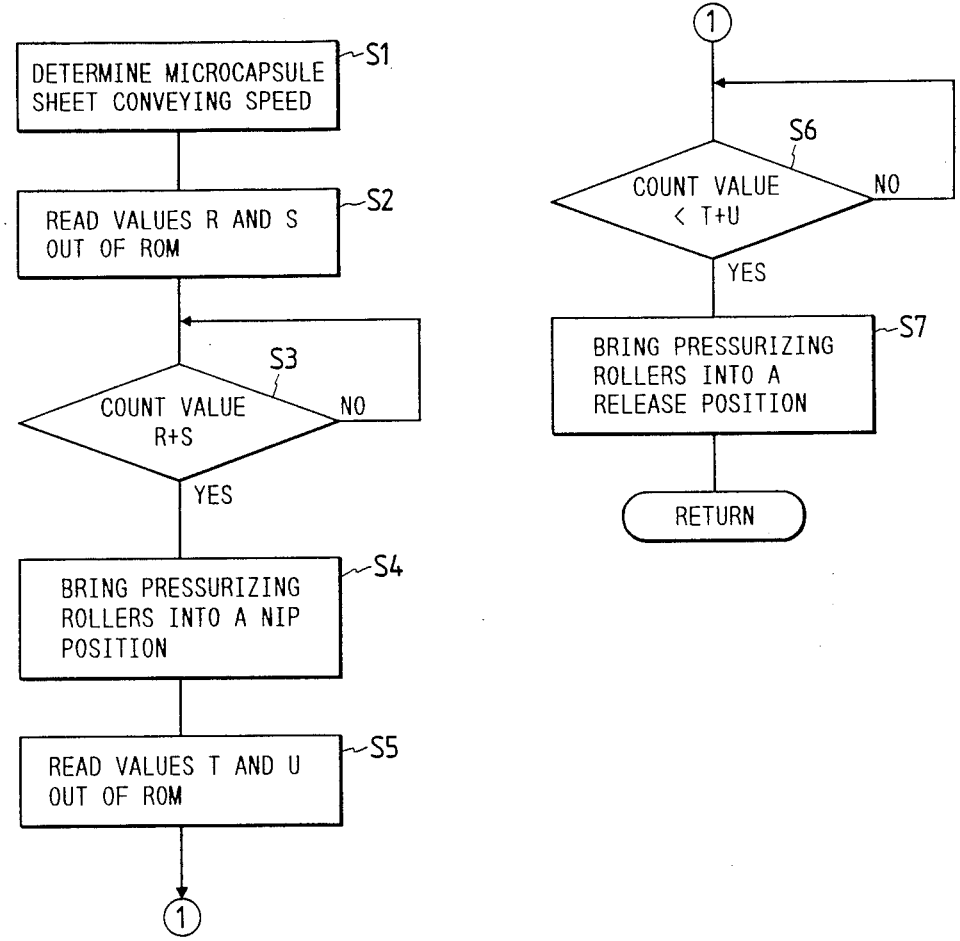
FIGS. 7 through 9 are flow charts for description of the operation of the control circuits according to the embodiments of the present invention.

In FIG. 7, shown is a partial program to be implemented by the CPU 55. In step 1, the CPU 55 determines the conveying speed of the microcapsule sheet 37 based on the position of the lens unit 9 (step 1). The counter which has been cleared at the time when the exposure starts counts up as the exposure proceeds. In step S2, the CPU 55 reads count values R and S out of the ROM 58 where the value R corresponds to the nip timing at which the microcapsule sheet conveying speed is the maximum and the value S corresponds to the nip timing to be corrected with respect to the value R. In step 3, the CPU 55 checks whether or not the counter value is smaller than R+S. When the CPU 55 determines that the counter value is smaller than R+S, the CPU 55 actuates the drive source 53 to thereby bring the pressurizing rollers 21, 31 into the nip position (step 4), whereupon the pressure development is started. It should be noted that the original support pane moving motor rotates at a constant speed irrespective of the copying magnification and the exposure amount.

Next, in step 5, the CPU 55 reads the count values T and U out of the ROM 55. The value T corresponds to the retract timing at which the microcapsule sheet conveying speed is the maximum and the value U corresponds the retract timing to be corrected with respect to the value T. In step 6, the CPU 55 checks whether or not the counter value is smaller than a value T+U. When the CPU 55 determines that the counter value is smaller than T+U, the CPU 55 actuates the drive source 53 to thereby bring the pressuring rollers 21, 31 into the retract position (step S7).

As described, according to this embodiment, the exposure start position on the microcapsule sheet 37 is accurately brought into alignment with the leading edge of the developer sheet 38 staying in the developing station 20. Therefore, the image to be formed on the developer sheet 38 is not displaced regardless of the change of the copying magnification and/or the change of the exposure amount. Further, since the pressure development is always performed under the condition where the microcapsule sheet 37 is superposed on the developer sheet 38, smearing of the rollers 21, 31 with the chromogenic materials can be prevented, which may otherwise be caused if the pressure development is performed in the absence of the developer sheet 38. In addition, the image quality will not be degraded due to the smearing of the pressurizing rollers, and thus the maintenance of the apparatus is facilitated.

A second embodiment of the present invention will be described with reference to FIGS., 8, 10A and 10B. The second embodiment concerns determination of the nip and retract timing while taking the length of the developer sheet into account.

In the image recording apparatus 40 shown in FIG. 1, a protrusion 32a and a sheet size detector 32b are provided in association with the developer sheet cassette 32. The sheet size detector 32b detects the size of the developer sheet 38 stacked in the cassette 32 while cooperating with the protrusion 32a. A sheet edge sensor 61 is disposed upstream of the developing station 20 for sensing the trailing end of the developer sheet 38.

In this embodiment, the timing at which the developer sheet 38 is fed out from the cassette 32 in coincidence with the exposure start timing, i.e., the timing at which the original support pane 2 starts moving leftwardly. Further, the developer sheet 38 is conveyed at a speed in synchronism with the microcapsule conveying speed.

Figure 8:
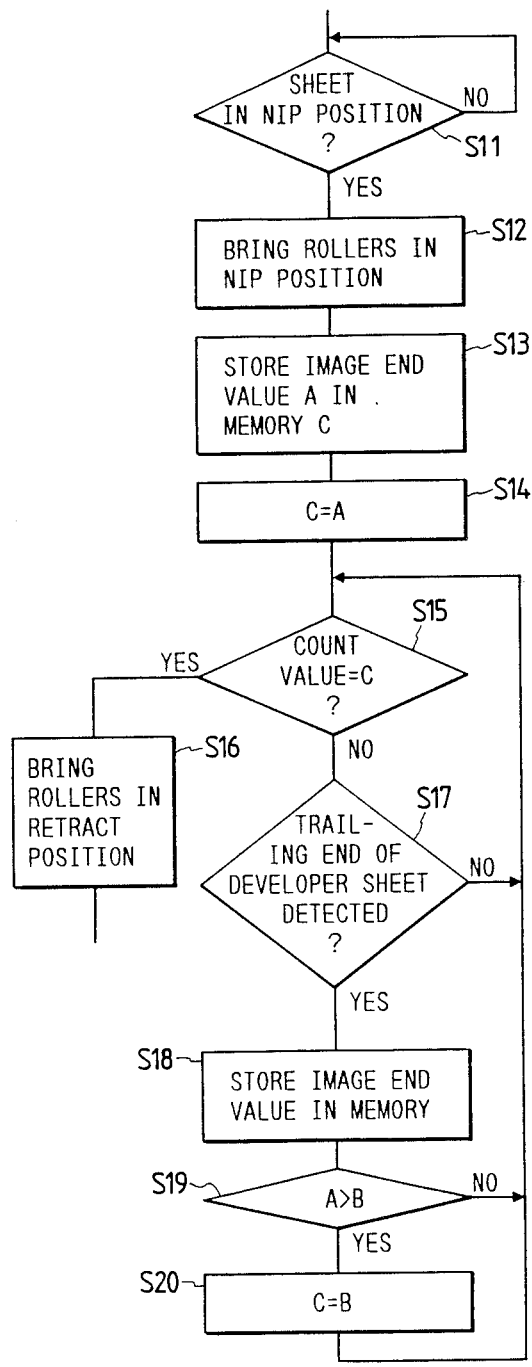
Figure 10A:
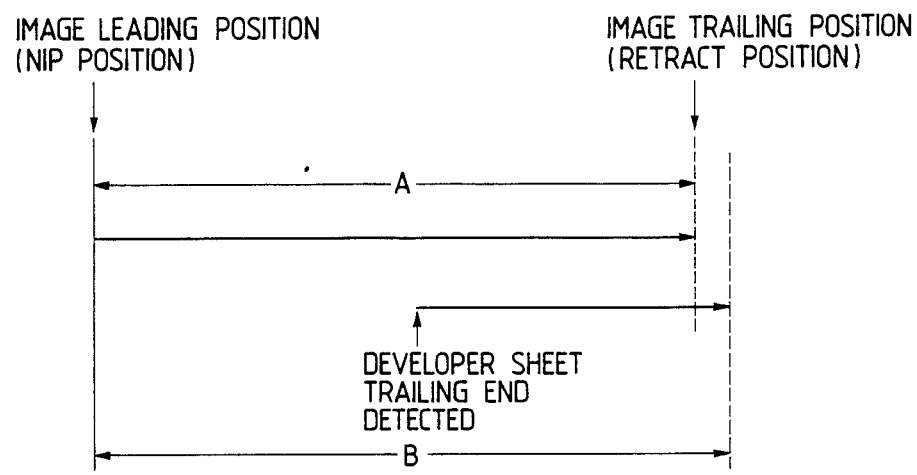
FIGS. 10A and 10B are explanatory diagram for description of the embodiment of the present invention.
Figure 10B:
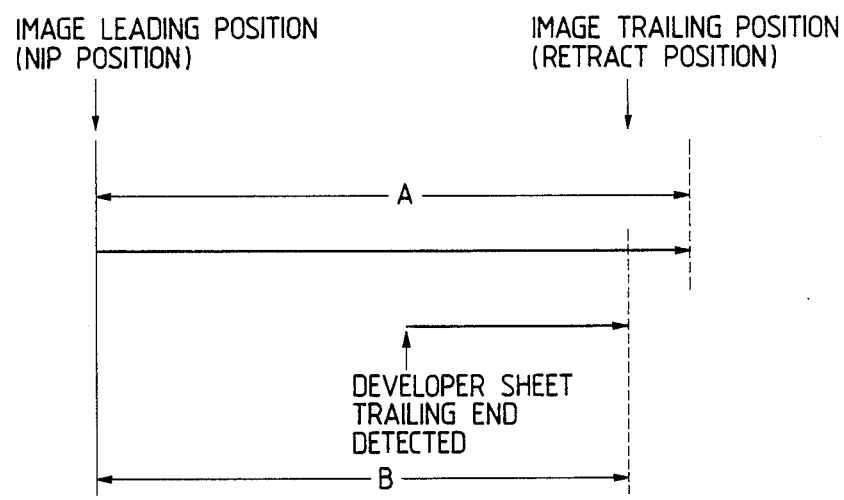

Referring to FIG. 8, decision is firstly made as to whether or not the developer sheet 38 and the microcapsule sheet 37 have been brought to the nip position with the leading end of the developer sheet 38 being in alignment with the exposure start line of the microcapsule sheet 37 (step 11). This decision is made based on the count number of the encoder provided in the microcapsule sheet conveying motor. If the decision made in step 11 is yes, the pressurizing rollers 21, 31 are brought to the nip position (step 12) to thus start pressure development. Simultaneously, the number of rotations of one of the pressurizing rollers 21, 31 is measured by a drive amount detecting means (not shown). An image end value A corresponding to the length of the developer sheet 38 is stored in a memory (step 13). The same value is also set in a counter C (step 14). As can be readily understood from FIG. 10A, the image end value A is equivalent to a retract timing determined corresponding to the length of the developer sheet 38, so the number of rotations of one of the pressurizing rollers 21, 31. Next, it is checked whether or not the number of rotations of the pressurizing roller which is counted by means of an encoder is equal to the value set in the counter C (step 15). If yes, the pressurizing rollers 21, 31 are brought to the retract position (step 16). If no, i.e., the number counted by the encoder is smaller than the count value set in the counter C, it is checked whether the trailing end of the developer sheet 38 has been sensed by the sensor 27 (step 17). If the trailing end of the developer sheet 38 has not yet been sensed thereby, the routine returns to step 15. If, on the other hand, the trailing end of the developer sheet 38 has been sensed thereby, the image end value B is determined based on the residual pressure developing length at the time when the trailing end of the developer sheet 38 is sensed, and the resultant value B is stored in the memory (step 18). As can be understood from FIG. 10B, the image end value B indicates the retract timing which is determined based on the distance between the sensor 61 and the pressurizing rollers 21, 31 and the rotational speed of the pressurizing rollers 21, 32. After the image end value B has been stored in the memory, the values A and B are compared (step 19). This comparison is necessary in the case where the length of the developer sheet 38 now being fed is shorter than the regular size. If the value A is smaller than the value B, the pressurizing rollers 21, 31 are brought to the retract position in accordance with the value A (steps 5 and 6), whereas if the value A is larger than the value B, the pressurizing rollers 21, 31 are brought to the retract position in accordance with the value B. To this effect, the value B is set to the counter C (step 20). Then, comparison is made if the number of rotations of the pressurizing roller is equal to the value B (step 15). If yes, the pressurizing rollers 21, 31 are brought to the retract position (step 16).

For the case in which the regular size developer sheet is used, it is advisable that the image end value B is set slightly larger than the image end value A, say about 2 to 3 mm. By so doing, the retract timing is determined based on the smaller value A, whereby the image formation can be performed accurately regardless of the positional variation of the sensor 61.

Although in this embodiment, description has been made so that the developer sheet 38 is conveyed at a speed in synchronism with the microcapsule sheet conveying speed, the developer sheet 38 can be convey at a speed asynchronous with the microcapsule conveying speed and the retract timing can be determined as described in the first embodiment.

According to the second embodiment, the retract timing can be accurately determined depending upon the size of the developer sheet, and the pressure development does not last even if the short length developer sheet has passed over the pressure developing zone. Accordingly, the smearing of the pressurizing rollers with the chromogenic material can be prevented which may otherwise be caused if the pressure development is being carried out in the absence of the developer sheet.

Figure 5:
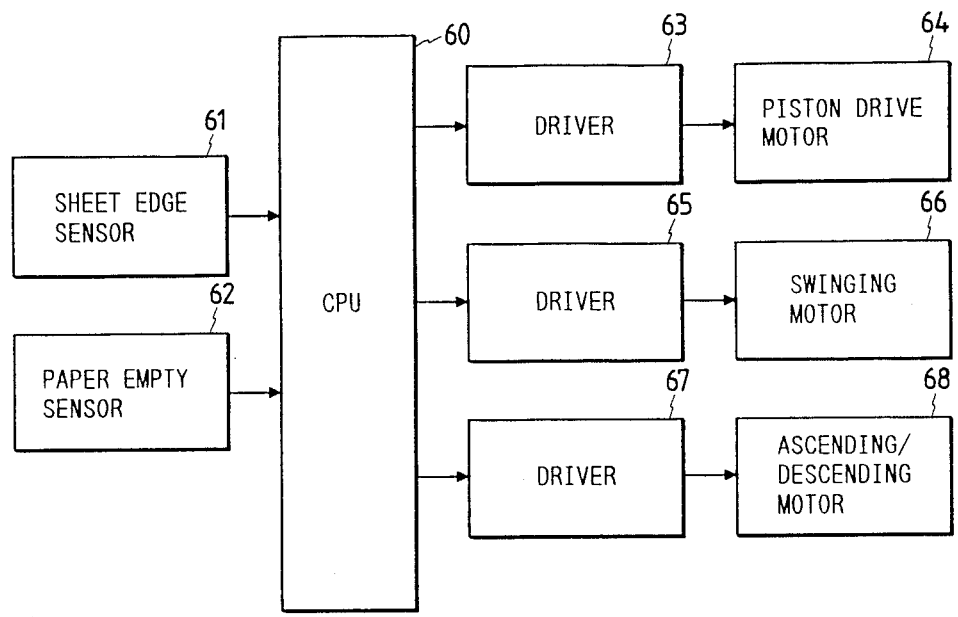

A third embodiment of the present invention will be described with reference to FIGS. 5 and 9. The second embodiment concerns determination of the timing at which the feeding of the developer sheet 38 into the pressure developing station 20 is commenced.

In the image recording apparatus 40, a sheet edge sensor 61 is provided upstream of the developing station 20 for sensing the leading and trailing ends of the developer sheet 38 fed from the cassette 32. Further, a paper empty sensor 62 is provided adjacent the developer sheet cassette 32 for detecting the emptiness of the developer sheet 38 in the cassette 32. As shown in FIG. 5, these sensors 61, 62 are connected to a CPU 60. Further, a piston drive motor 64, a swinging motor 66 for swinging movement of the feedout member 33, and an ascending/descending motor 68 for vertical movement of the feedout member 33 are connected through the respective drivers 63, 65 and 67 to the CPU 60. The piston drive motor 64 is for driving a piston (not shown). In accordance with reciprocal movement of the piston, a negative pressure is applied to the suction cup of the feedout member 33.

In operation, the CPU 60 drives the motor 68 to descend the feedout member 33. Upon receiving from the paper empty sensor 62 a signal indicative of the presence of the developer sheet 38 in the cassette 32, the CPU 60 ceases the rotations of the motor 68. Thereafter, the CPU 60 drives the swinging motor 66 to thereby impart a swinging movement to the feedout member 33. After the feedout member 33 is swung a predetermined angle, the CPU 60 drives the piston drive motor 64 to apply a negative pressure to the suction cup, so that the uppermost developer sheet 38 is attracted to the suction cup. Thereafter, the CPU 60 drives the motor 68 to ascend the feedout member 33 and drives the motor 66 to swing the feedout member 33 in the opposite direction. At this time, the drivings of the motors 64 and 66 are ceased at the time when the developer sheet 38 has reached to a predetermined position, whereby the developer sheet 38 is released from the suction cup. Meanwhile, when the CPU 60 receives from the paper empty sensor 62 a signal indicative of the emptiness of the developer sheet 38, the CPU 60 does not implement the above-described sheet feeding operation.

Figure 9:
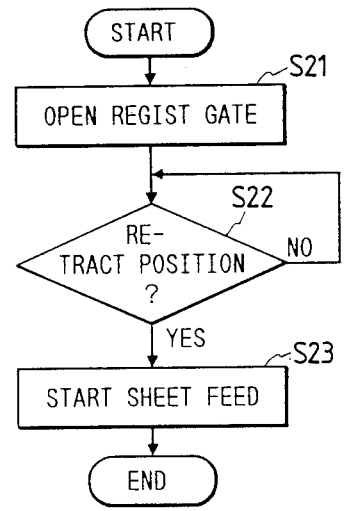

When the same original is subjected to copying a number of times (continuous copying), the timing at which the developer sheet 38 is fed into the developing station is controlled as shown in the flow chart of FIG. 9.

When the continuous copying is started, the leading end of the developer sheet 38 is subjected to registration by the feed rollers 34 and the regist gate 35 and the regist gate 35 is opened (step 21). Then, the CPU 60 checks whether or not the pressurizing roller 21, 31 are in retract condition (step 22) based on the rotational angle of the cam shaft 46. When the CPU 60 determines that the pressurizing rollers 21, 31 are in the retracted position, the CPU 60 starts the feeding of the developer sheet 38 in the manner as described above (step 23). On the other hand, when the CPU 60 determines that the pressurizing rollers 21, 31 are in the nip position, the feeding of the developer sheet 38 is not performed until the rollers have been brought to the retract position.

As described above, according to the third embodiment, the timing at which the developer sheet is fed out from the cassette is determined upon detecting whether or not the pressurizing rollers are in the retract position unlike the prior art in which the timing has been set to coincide with the exposure start timing, i.e., the timing at which the original support pane 2 starts moving leftwardly. Accordingly, the subsequently fed developer sheet is not introduced into the developing station while the precedingly fed developer sheet is staying therein.

Figure 6:
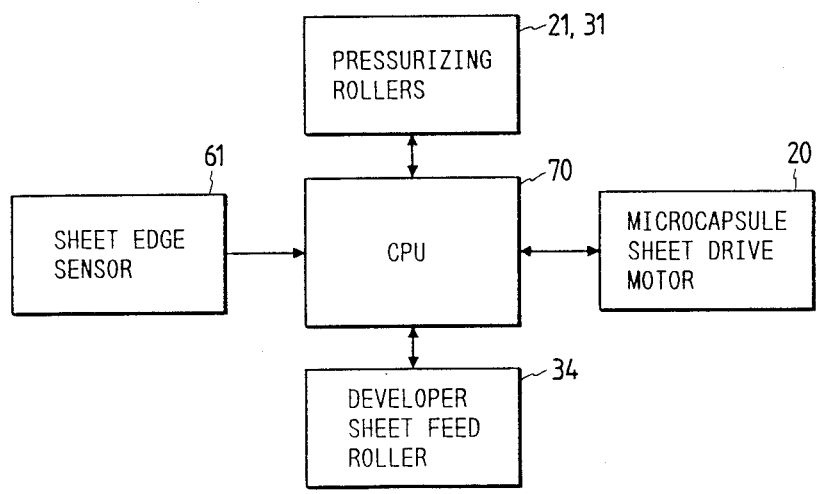

A fourth embodiment of the present invention will be described with reference to FIGS. 6. The fourth embodiment of the invention concerns the feeding of the developer sheet 38.

The sheet sensor 61 is used to sense the leading end of the developer sheet 38. The sensor 61 is connected to a CPU 70. The sensor 61 outputs a signal to the CPU 70 when the leading end thereof is sensed. In response to the signal fed from the sensor 61, the CPU 71 controls the developer sheet feed roller 34 to convey the developer sheet 38 a predetermined distance, whereby the leading end of the developer sheet 38 is brought to a position ahead of the nip position by about 3 mm. The pressurizing rollers 21, 31 are coupled to the CPU 70 and are controlled thereby so that at the time when the developer sheet 38 is being conveyed toward the developing station 20, the pressurizing rollers 21, 31 have been held in spaced apart condition allowing the developer sheet 38 to pass through. A microcapsule feed roller 22 is coupled to the CPU 70, and the latter issues a signal to the roller 22 to convey the microcapsule sheet 37. When the microcapsule sheet 37 has been conveyed and has passed through the opening between the rollers 21, 31, the CPU 70 issues a signal to the pressurizing rollers 21, 31, whereby the latter are brought to the nip position at a predetermined timing. The pressure development is thereby started. Simultaneously, the CPU 70 issues a signal to the feed rollers 34 to rotate the same, thereby further conveying the developer sheet 38 toward the pressure developing station 20. When the developer sheet 38 has been conveyed by the feed rollers 34 an amount corresponding to a distance between the feed rollers 34 and the pressurizing rollers 21, 31, the rotations of the feed rollers 34 are stopped. Thereafter, the conveyance of the developer sheet 38 is performed by the pressurizing rollers 21, 31.

According to the fourth embodiment, even if the initially conveyed amount of the developer sheet 38 were in short of the predetermined distance, the developer sheet 38 is subsequently forcibly forwarded to the developing station, thereby ensuring the feeding of the developer sheet 38 into the developing station. Accordingly, even if only the microcapsule sheet 37 is nipped between the pressurizing rollers at the start of the developing operation, the developer sheet 38 will be fed therebetween shortly. Thus, the smearing of the pressurizing rollers with the chromogenic material can be suppressed at minimum.

Although the different aspects of the present invention have been described separately, it should be noted that the various embodiments of the present invention can be practiced by properly combining the embodiments described.

Although the present invention has been described with reference to specific embodiments, it should be understood that a variety of changes and modifications may be made without departing from the scope and spirit of the invention. For example, two sensors have been described for sensing the leading and trailing ends of the developer sheet, one may be dispensed with.

What is claimed is:

1. An image recording apparatus for recording an image of an original document on a developer sheet with the use of a photosensitive pressure sensitive sheet, the developer sheet having leading and trailing ends and having a surface coated with a developer material, the photosensitive pressure-sensitive sheet having a surface coated with immense number of photosensitive and pressure-rupturable microcapsules, each encapsulating a chromogenic material, the apparatus comprising:

exposure means for exposing the photosensitive pressure-sensitive sheet to imaging light over a part of the photosensitive pressure-sensitive sheet, the part being defined by leading and trailing exposure lines to selectively change mechanical strength of the microcapsules in the part and to thereby form a latent image thereon;

first conveying means for conveying the photosensitive pressure-sensitive sheet formed with the latent image thereon;

pressure developing means having a pressure developing position for pressure developing the latent image and reproducing a visible image on the developer sheet upon reaction of the chromogenic material released from ruptured microcapsules with the developer material, said pressure developing means including a pair of pressurizing members;

second conveying means for conveying the developer sheet in a direction toward said pressure developing means;

actuating means for actuating at least one of said first and second pressurizing members to selectively bring said first and second pressurizing members in a spaced apart condition and an intimate contact condition, said first and second pressurizing members being held in the spaced apart condition when the developer sheet is conveyed by said second conveying means; and stopping means for temporarily stopping the conveyance of the developer sheet by said second conveying means when the leading end of the developer sheet has been introduced between the pressurizing members held in spaced apart condition, wherein said actuating means actuates at least one of said first and second pressurizing members to bring them in the intimate contact condition at a timing when the exposure leading end of the photosensitive pressure-sensitive sheet is in alignment with the leading end of the developer sheet to thus start the pressure development.

2. An image recording apparatus according to claim 1, wherein the photosensitive pressure-sensitive sheet is conveyed by said first conveying means at a preselected speed and said actuating means further actuates at least one of said first and second pressurizing members to bring them in the spaced apart condition in accordance with the preselected speed to thus terminate the pressure development.

3. An image recording apparatus according to claim 2, wherein conveying speed of the photosensitive pressure-sensitive sheet by said first conveying means is determined depending upon a copying magnification defined by a reproduced image size with respect to an original image size.

4. An image recording apparatus according to claim 2, wherein conveying speed of the photosensitive pressure-sensitive sheet by said first conveying means is determined depending upon an amount of the imaging light.

5. An image recording apparatus according to claim 2, wherein said actuating means comprises a cam member having a cam surface in contact with one of said first and second pressurizing members, and a motor operatively connected to said cam member for moving the cam surface, wherein said one of said first and second pressurizing members is selectively brought to the spaced apart condition and the intimate contact condition in accordance with rotation of said motor.

6. An image recording apparatus according to claim 2, wherein said photosensitive pressure-sensitive sheet is in the form of an elongated web-like sheet.

7. An image recording apparatus according to claim 1, further comprising status detecting means for detecting whether said first and second pressurizing members are held in the spaced apart condition or in the intimate contact condition and outputting an inhibition signal when said first and second pressurizing members are held in the intimate contact condition, and wherein said second conveying means is inhibited from conveying the developer sheet in response to the inhibition signal.

8. An image recording apparatus according to claim 7, wherein conveying speed of the photosensitive pressure-sensitive sheet by said first conveying means is determined depending upon a copying magnification defined by a reproduced image size with respect to an original image size.

9. An image recording apparatus according to claim 7, wherein conveying speed of the photosensitive pressure-sensitive sheet by said first conveying means is determined depending upon an amount of the imaging light.

10. An image recording apparatus according to claim 7, wherein said actuating means comprises a cam member having a cam surface in contact with one of said first and second pressurizing members, and a motor operatively connected to said cam member for moving the cam surface, wherein said one of said first and second pressurizing members is selectively brought to the spaced apart condition and the intimate contact condition in accordance with rotation of said motor.

11. An image recording apparatus according to claim 7, wherein said photosensitive pressure-sensitive sheet is in the form of an elongated web-like sheet.

12. An image recording apparatus according to claim 1, further comprising first sheet detecting means disposed upstream of said pressure developing means with respect to the developer sheet conveying direction for detecting the trailing end of the developer sheet and producing a trailing end detection signal, and wherein the pressurizing members are brought to the spaced apart condition in response to the trailing end detection signal.

13. An image recording apparatus according to claim 12, further comprising drive amount detecting means for detecting a drive amount of one of said first and second pressurizing members, and comparison means for comparing distances from the trailing exposure line to the pressure developing position individually computed on the basis of the trailing end detection signal and the drive amount, and wherein the pressurizing members are brought to the spaced apart condition in response to the trailing end detection signal or the drive amount whichever indicates the shorter distance.

14. An image recording apparatus according to claim 13, wherein conveying speed of the photosensitive pressure-sensitive sheet by said first conveying means is determined depending upon a copying magnification defined by a reproduced image size with respect to an original image size.

15. An image recording apparatus according to claim 13, wherein conveying speed of the photosensitive pressure-sensitive sheet by said first conveying means is determined depending upon an amount of the imaging light.

16. An image recording apparatus according to claim 13, wherein said actuating means comprises a cam member having a cam surface in contact with one of said first and second pressurizing members, and a motor operatively connected to said cam member for moving the cam surface, wherein said one of said first and second pressurizing members is selectively brought to the spaced apart condition and the intimate contact condition in accordance with rotation of said motor.

17. An image recording apparatus according to claim 13, wherein said photosensitive pressure-sensitive sheet is in the form of an elongated web-like sheet.

18. An image recording apparatus according to claim 1, further comprising second sheet detecting means disposed upstream of said pressure developing means with respect to the developer sheet conveying direction for detecting the leading end of the developer sheet and producing a leading end detection signal, and wherein said second conveying means again conveys the developer sheet when said actuating means actuates at least one of said first and second pressurizing members to bring them in the intimate contact condition.

19. An image recording apparatus according to claim 18, wherein conveying speed of the photosensitive pressure-sensitive sheet by said first conveying means is determined depending upon a copying magnification defined by a reproduced image size with respect to an original image size.

20. An image recording apparatus according to claim 18, wherein conveying speed of the photosensitive pressure-sensitive sheet by said first conveying means is determined depending upon an amount of the imaging light.

21. An image recording apparatus according to claim 18, wherein said actuating means comprises a cam member having a cam surface in contact with one of said first and second pressurizing members, and a motor operatively connected to said cam member for moving the cam surface, wherein said one of said first and second pressurizing members is selectively brought to the spaced apart condition and the intimate contact condition in accordance with rotation of said motor.

22. An image recording apparatus according to claim 18, wherein said photosensitive pressure-sensitive sheet is in the form of an elongated web-like sheet.

23. An image recording apparatus for recording an image of an original document on a developer sheet with the use of a photosensitive pressure sensitive sheet, the developer sheet having leading and trailing ends and having a surface coated with a developer material, the photosensitive pressure-sensitive sheet having a surface coated with immense number of photosensitive and pressure-rupturable microcapsules, each encapsulating a chromogenic material, the apparatus comprising:

exposure means for exposing the photosensitive pressure-sensitive sheet at a position to imaging light over a part of the photosensitive pressure-sensitive sheet, the part being defined by leading and trailing exposure lines to selectively change mechanical strength of the microcapsules in the part and to thereby form a latent image thereon;

first conveying means for conveying the photosensitive pressure-sensitive sheet formed with the latent image thereon at a speed;

pressure developing means having a pressure developing position for pressure developing the latent image and reproducing a visible image on the developer sheet upon reaction of the chromogenic material released from ruptured microcapsules with the developer material, said pressure developing means including a pair of pressurizing members;

second conveying means for conveying the developer sheet in a direction toward said pressure developing means;

actuating means for actuating at least one of said first and second pressurizing members to selectively bring said first and second pressurizing members in a spaced apart condition and an intimate contact condition, said first and second pressurizing members being held in the spaced apart condition when the developer sheet is conveyed by said second conveying means; and control means for controlling said actuating means so that said first and second pressurizing members are brought to the intimate contact condition after a first predetermined period of time has elapsed from a start of the exposure to thus start the pressure development, the first predetermined period of time being defined by a distance between the exposure position and the pressure developing position and the photosensitive pressure-sensitive conveying speed.

24. An image recording apparatus according to claim 23, wherein said control means controls said actuating means so that said first and second pressurizing members are brought to the spaced apart position after a second predetermined period of time has elapsed from the start of the exposure to thus terminate the pressure development, the second predetermined period of time being defined by the distance between the exposure position and the pressure developing position and the photosensitive pressure-sensitive conveying speed.

25. An image recording apparatus according to claim 24, wherein conveying speed of the photosensitive pressure-sensitive sheet by said first conveying means is determined depending upon a copying magnification defined by a reproduced image size with respect to an original image size.

26. An image recording apparatus according to claim 24, wherein conveying speed of the photosensitive pressure-sensitive sheet by said first conveying means is determined depending upon an amount of the imaging light.

27. An image recording apparatus according to claim 24, wherein said actuating means comprises a cam member having a cam surface in contact with one of said first and second pressurizing members, and a motor operatively connected to said cam member for moving the cam surface, wherein said one of said first and second pressurizing members is selectively brought to the spaced apart condition and the intimate contact condition in accordance with rotation of said motor.

28. An image recording apparatus according to claim 24, wherein said photosensitive pressure-sensitive sheet is in the form of an elongated web-like sheet.

29. A method of recording an image of an original document on a developer sheet with the use of a photosensitive pressure sensitive sheet, the developer sheet having leading and trailing ends and having a surface coated with a developer material, the photosensitive pressure-sensitive sheet having a surface coated with immense number of photosensitive and pressure-rupturable microcapsules, each encapsulating a chromogenic material, the method comprising the steps of:

exposing a part of the photosensitive pressure-sensitive sheet to imaging light to selectively change mechanical strength of the microcapsules in the part and to thereby form a latent image thereon, the part being defined by leading and trailing exposure lines;

conveying the photosensitive pressure-sensitive sheet formed with the latent image thereon;

pressure developing the latent image at a pressure developing position with a pair of pressurizing members and reproducing a visible image on the developer sheet upon reaction of the chromogenic material released from ruptured microcapsules with the developer material;

conveying the developer sheet in a direction toward said pressurizing members;

actuating at least one of said first and second pressurizing members to selectively bring said first and second pressurizing members in a spaced apart condition and an intimate contact condition, said first and second pressurizing members being held in the spaced apart condition when the developer sheet is conveyed by said second conveying means; and temporarily stopping the conveyance of the developer sheet when the leading end of the developer sheet has been introduced between the pressurizing members held in spaced apart condition, wherein at least one of said first and second pressurizing members being actuated to bring them in the intimate contact condition at a timing when the exposure leading end of the photosensitive pressure-sensitive sheet is in alignment with the leading end of the developer sheet to thus start the pressure development.

30. A method according to claim 29, wherein the photosensitive pressure-sensitive sheet is conveyed at a preselected speed and at least one of said first and second pressurizing members are further actuated to be brought to the spaced apart condition in accordance with the preselected speed to thus terminate the pressure development.

31. A method according to claim 29, further comprising the steps of detecting the leading end of the developer sheet and producing a detection signal and the developer sheet is again conveyed after at least one of said first and second pressurizing rollers are brought to the intimate condition.

* * * * *